(12) United States Patent
Bhattacharjee et al.

(10) Patent No.: US 8,255,398 B2
(45) Date of Patent: Aug. 28, 2012

(54) COMPRESSION OF SORTED VALUE INDEXES USING COMMON PREFIXES

(75) Inventors: Bishwaranjan Bhattacharjee, Yorktown Heights, NY (US); Sherman Lau, Markham (CA); Lipyeow Lim, North White Plains, NY (US); Timothy R. Malkemus, Leander, TX (US); Cathy McArthur, Uxbridge (CA); George A. Mihaila, Yorktown Heights, NY (US); Reza Sherkat, Richmond Hill (CA); Zoltan G. Toth, Toronto (CA)

(73) Assignee: International Business Machines Corporation, Armonk, NY (US)

( * ) Notice: Subject to any disclaimer, the term of this patent is extended or adjusted under 35 U.S.C. 154(b) by 861 days.

(21) Appl. No.: 12/241,458

(22) Filed: Sep. 30, 2008

(65) Prior Publication Data

US 2010/0082545 A1    Apr. 1, 2010

(51) Int. Cl.
*G06F 7/00*     (2006.01)
*G06F 17/30*    (2006.01)

(52) U.S. Cl. ...................................................... 707/736
(58) Field of Classification Search .................. 707/736, 707/999.101
See application file for complete search history.

(56) References Cited

U.S. PATENT DOCUMENTS

| | | | |
|---|---|---|---|
| 5,274,805 A * | 12/1993 | Ferguson et al. | ..................... 1/1 |
| 5,797,008 A | 8/1998 | Burrows | |
| 5,999,936 A | 12/1999 | Pattison et al. | |
| 6,275,927 B2 | 8/2001 | Roberts | |
| 2007/0061546 A1 | 3/2007 | Berger et al. | |
| 2007/0106876 A1 | 5/2007 | Goswami | |
| 2007/0271289 A1 * | 11/2007 | Livshits | ........................ 707/101 |
| 2010/0036862 A1 * | 2/2010 | Das et al. | ..................... 707/101 |

OTHER PUBLICATIONS

Ziv, et al., "Compression of Individual Sequences via Variable-Rate Coding," *IEEE Transactions on Information Theory*, 1978, pp. 530-536, 24(5).
Antoshenkov, et al., "Query processing and optimization in Oracle Rdb," *The VLDB Journal*, 1996, pp. 229-237.
Bayer, et al., "Prefix B-Trees," *ACM Transactions on Database Systems*, Mar. 1977, pp. 11-26, 2(1).
Antoshenkov, et al., "Order Preserving Key Compression," *Digital Equipment Corporation Cambridge Research Lab*, Jun. 16, 1994, pp. 1-27, CRL 94/3.
Harrison, A., "Firebird for the Database Expert: Episode 1—Indexes," http://www.sqlmanager.net/en/articles/692, 4 pages, 2005.

* cited by examiner

*Primary Examiner* — Kimberly Wilson
(74) *Attorney, Agent, or Firm* — Jeffrey N. Giunta; Fleit Gibbons Gutman Bongini & Bianco PL

(57) ABSTRACT

A method, information processing system, and computer program storage product to compress sorted values. At least a first prefix and a second prefix in a plurality of prefixes are compared. Each prefix comprises at least a portion of a plurality of sorted values. A respective prefix comprises a set of consecutive characters including at least a first character of a respective sorted value. The respective sorted value further comprising a respective suffix comprising consecutive characters of the respective sorted value that are after the respective prefix. At least a respective first character of the first prefix and a respective first character of the second prefix are determined to be substantially identical. The first prefix is merged with the second prefix into a single prefix comprising the first character. A set of suffixes associated with the first prefix is updated to reflect an association with the second prefix.

24 Claims, 9 Drawing Sheets

Multipart key: Date | LocationID | CustomerID | ProductID
202 — 20080602 | S32 | C73827 | 2772683
204 — 20080602 | S32 | C73827 | 2772726
206 — 20080602 | S32 | C73827 | 2772742
208 — 20080602 | S32 | C73827 | 2772823

```
402 ─── (k,rid) = get next key and rid from sort
404 ─── storePrefix(NULL, 0)
406 ─── storeSuffix(km, NULL, rid, suffixDir)
        while(1)
        {
408 ───   (kNext,ridNext) = get next key and rid
410 ───   if (KNext == NULL) {
412 ───     storeSuffix(NULL, NULL, 0, suffixDir)
414 ───     storePrefix(NULL, suffixDir)
            break;
          }
416 ───   if (kNext == k) {
418 ───     storeSuffix(NULL, NULL, ridNext, suffixDir)
          }
          else {
420 ───     pre = compare(kNext, k)
422 ───     lastPre = getPrefix(prefixDir)
424 ───     firstDifPart = compare(pre, lastPre)
426 ───     if (firstDifPart == -1) {
428 ───       storeSuffix(kNext, pre, ridNext, suffixDir)
            }
430 ───     else if (firstDifPart > len_in_key_parts(lastPre)) {
432 ───       storePrefix(pre, suffixDir)
434 ───       adjustSuffix(suffixDir)
436 ───       storeSuffix(suffixDir)
            }
438 ───     else { // firstDifPart < len_in_key_parts(lastPre)
440 ───       storeSuffix(kNext, pre, ridNext, suffixDir)
442 ───       storePrefix(pre, suffixDir)
444 ───       triggerOptimization(prefixDir, SuffixDir)
            }
          }
446 ───   k=knext, rid = ridnext
        }
448 ─── triggerOptimization(prefixDir+1, suffixDir+1)
        return
```

FIG. 4

```
        victimPrefix = getPrefix(prefixDir - 1)
        leftPrefix = getPrefix(prefixDir - 2)
        rightPrefix = getPrefix(prefixDir)

502 ─── if (leftPrefix == rightPrefix)
        {
504 ───   if (compare(leftPrefix, victimPrefix) == len_in_key_parts(leftPrefix)) {
506 ───     incrementalSavings = bytelen(victimPrefix) - bytelen(leftPrefix)
508 ───     nOccVictim = getOcc(prefixDir - 1)
510 ───     benefit = (bytelen(victimPrefix) + 2* prefixOverhead) - nOccVictim * incrementalSavings
512 ───     if (benefit > 0) {
514 ───       merge(prefixDir - 1, prefixDir - 2)
516 ───       merge(prefixDir, PrefixDir - 2)
            }
          }
        }
        else
        {
518 ───   if (compare(leftPrefix, victimPrefix) == len_in_key_parts(leftPrefix)) {
520 ───     incrementalSavings = bytelen(victimPrefix) - bytelen(leftPrefix)
522 ───     nOccVictim = getOcc(prefixDir - 1)
524 ───     benefit = (bytelen(victimPrfix) + prefixOverhead) -nOccVictim *incrementalSavings
526 ───     if (benefit > 0) {
528 ───       merge(prefixDir - 1, prefixDir - 2)
            }
          }

530 ───   if (compare(rightPrefix, victimPrefix) == len_in_key_parts(rightPrefix)) {
532 ───     incrementalSavings = bytelen(victimPrefix) - bytelen(rightPrefix)
534 ───     nOccVictim = getOcc(prefixDir - 1)
536 ───     benefit = (bytelen(victimPrefix) + prefixOverhead) - nOccVictim * incrementalSavings
538 ───     if (benefit > 0) {
540 ───       merge(prefixDir, prefixDir - 1)
            }
          }
        }
        return
```

FIG. 5

```
602 — for (slot = first slot of source; slot < first slot of (source + 1); slot++) {
604 — prepend diff(getPrefix(source), getPrefix(dest)) to suffix(slot)
       }
606 — mark source prefix deleted in prefix directory
       if (dest > source) {
608 — copy firstSlot from source to dest in prefix directory
       }
       return
```

FIG. 6

| Key: RID | current prefix | prefix directory | suffix directory |
|---|---|---|---|
| aabc : r1 | NULL | NULL | aabc : r1 |
| aabd : r2 | aab | NULL \| aab | \| c : r1 ; d : r2 |
| aabd : r3 | aabd | NULL \| aab | \| c : r1 ; d : r2 , r3 |
| aaba : r4 | a | NULL \| aab \| a | \| c : r1 ; d : r2 , r3 \| bca : r4 |
| aabd : r5 | abc | NULL \| aab \| abc | \| c : r1 ; d : r2 , r3 \| a : r4 ; d : r5 |
| aabe : r6 | abc | NULL \| aab \| abc | \| c : r1 ; d : r2 , r3 \| a : r4 ; d : r5 ; e : r6 |
| aabf : r7 | ab | NULL \| aab \| abc \| ab | \| c : r1 ; d : r2 , r3 \| a : r4 ; d : r5 ; e : r6 \| df : r7 |
|  | ab | NULL \| aab \| ab | \| c : r1 ; d : r2 , r3 \| ca : r4 ; cd : r5 , ce : r6 ; df : r7 |

COMPRESSION OF SORTED VALUE INDEXES USING COMMON PREFIXES

FIELD OF THE INVENTION

The present invention generally relates to the field of data compression, and more particularly relates to compressing sorted value indexes using common prefixes.

BACKGROUND OF THE INVENTION

Generally, keys are stored in B+-Tree leaf pages in uncompressed format resulting in large amounts of storage space being wasted. Because keys are stored in a sorted fashion, it is very likely that many keys stored in the same leaf page share a common prefix, especially for large or multi-column keys. This space inefficiency is able to affect the runtime performance because some operations read more pages from the disk than is necessary, for example, during an index scan operation.

SUMMARY OF THE INVENTION

In one embodiment, a method for compressing sorted values is disclosed. The method includes comparing at least a first prefix and a second prefix in a plurality of prefixes. Each prefix within the plurality of prefixes comprises at least a portion of a plurality of sorted values. A respective prefix within the plurality of prefixes comprises a set of consecutive characters including at least a first character of a respective sorted value within the plurality of sorted values. The respective sorted value further comprising a respective suffix comprising consecutive characters of the respective sorted value that are after the respective prefix. At least a respective first character of the first prefix and a respective first character of the second prefix are determined to be substantially identical. The first prefix is merged with the second prefix into a single prefix comprising the at least first character in response to the determining. A set of suffixes associated with the first prefix is updated to reflect an association with the second prefix in response to the merging.

In another embodiment, an information processing system for compressing sorted values is disclosed. The information processing system includes a memory and a processor that is communicatively coupled to the memory. The information processing system also includes a data manager that is communicatively coupled to the memory and the processor. The data manager is adapted to compare at least a first prefix and a second prefix in a plurality of prefixes. Each prefix within the plurality of prefixes comprises at least a portion of a plurality of sorted values. A respective prefix within the plurality of prefixes comprises a set of consecutive characters including at least a first character of a respective sorted value within the plurality of sorted values. The respective sorted value further comprising a respective suffix comprising consecutive characters of the respective sorted value that are after the respective prefix. The data manager is also adapted to determine that at least a respective first character of the first prefix and a respective first character of the second prefix are substantially identical. A compression manager is adapted to merge the first prefix with the second prefix into a single prefix comprising the at least first character. The compression manager is further adapted to update a set of suffixes associated with the first prefix to reflect an association with the second prefix in response to the merging.

In yet another embodiment a computer program storage product for compressing sorted values is disclosed. The computer program storage product includes instructions for comparing at least a first prefix and a second prefix in a plurality of prefixes. Each prefix within the plurality of prefixes comprises at least a portion of a plurality of sorted values. A respective prefix within the plurality of prefixes comprises a set of consecutive characters including at least a first character of a respective sorted value within the plurality of sorted values. The respective sorted value further comprising a respective suffix comprising consecutive characters of the respective sorted value that are after the respective prefix. At least a respective first character of the first prefix and a respective first character of the second prefix are determined to be substantially identical. The first prefix is merged with the second prefix into a single prefix comprising the at least first character in response to the determining. A set of suffixes associated with the first prefix is updated to reflect an association with the second prefix in response to the merging.

In a further embodiment, a database system for compressing sorted values is disclosed. The database system comprises a plurality of ordered indexes. Each index within the plurality of indexes has a respective suffix and an association to a respective prefix within a sorted plurality of prefixes. A data manager is adapted to compare at least a first prefix and a second prefix in the plurality of prefixes. The data manager is further adapted to determine that at least a respective first character of the first prefix and a respective first character of the second prefix are substantially identical. A compression manager is adapted to merge the first prefix with the second prefix into a single prefix comprising the at least first character in response to the at least a respective first character of the first prefix and the respective first character of the second prefix being substantially identical. The compression manager is further adapted to update a set of suffixes associated with the first prefix to reflect an association with the second prefix in response to the first prefix and the second prefix being merged into a single prefix.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 4 is pseudo code for one example of compressing sorted date values according to one embodiment of the present invention;

FIG. 5 is pseudo code for one example of optimizing the compression of sorted date values according to one embodiment of the present invention;

FIG. 6 is pseudo code for one example of merging compressed prefixes as part of the compression optimization of FIG. 5 according to one embodiment of the present invention;

FIG. 7 is an illustrative example of optimizing sorted data value compression according to one embodiment of the present invention;

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Operating Environment

Figure 1:
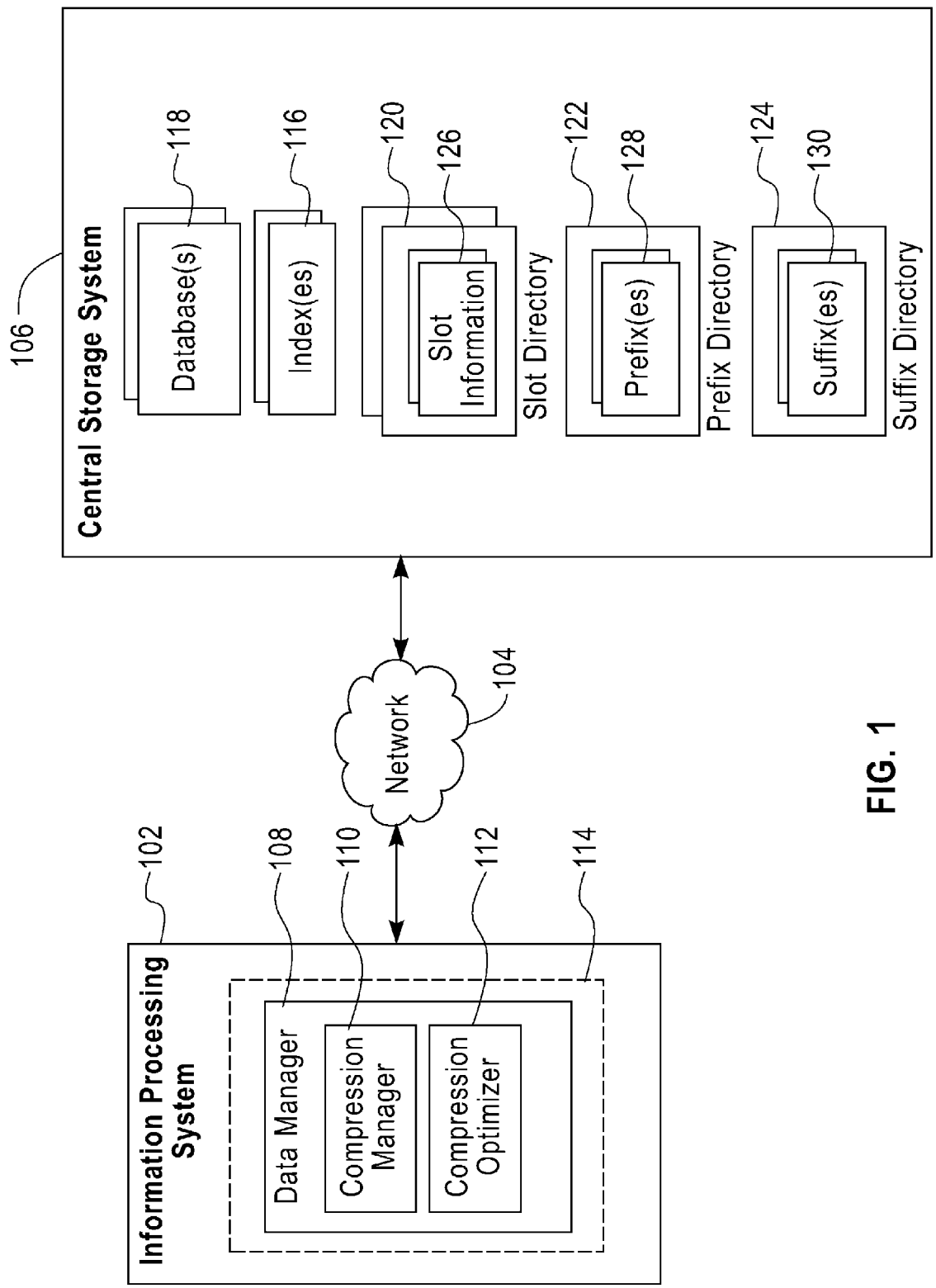
FIG. 1 is a block diagram illustrating one example of an operating environment according to one embodiment of the present invention.

According to one embodiment of the present invention, as shown in FIG. 1, a system 100 for optimizing the compression of data such as database indexes is shown. It should be noted that throughout the following discussion database indexes are used only as one example of the type of data applicable to the various embodiments of the present invention. Any type of sorted data that can be stored in a compressed format is also applicable to the various embodiments of the present invention as well.

Also, even though the following discussion is with respect to B+-Tree index leaf pages, the present invention is not limited to such an embodiment. For example, the various embodiments of the present invention are also applicable whenever there is a need to compress a sorted array of values. The slot 120, prefix 122, and suffix 124 directories can be implemented in any data structure, not necessarily in an index leaf page. For example, if one wants to compress a file containing a set of values, one can first sort the file, and then apply one or more of the various embodiments of the present invention to extract and optimize common prefixes. The directories 120, 122, 124, the prefixes 128, and the suffixes 130 can then be stored in the compressed file. In this example, the directories 120, 122, 124 apply to the entire set of key values in the file, instead of being local to a page.

In one embodiment, the system 100 includes one or more information processing systems 102, a network 104, and one or more central storage systems 106. The network 104, in one embodiment, is a wide area network, local area network, wireless network, or the like. The information processing system 102 includes a data manager 108 for creating one or more indexes of data, compressing the indexes, and optimizing the compression of the indexes. The data manager 108, in one embodiment, includes a compression manager 110 and a compression optimizer 112. The compression manager 110 compresses data such as a database index (if possible) to save disk space and processing resources. The compression optimizer 112 optimizes the compression of the data to further save resources.

In an embodiment where database indexes are being compressed, the data manager 108 can be part of a database management system 114. In further embodiments, however, the data manager 108 and its components are able to be separate from a database management system 114. The data manager 108, index compression manager 110, and compression optimizer 112 are discussed in greater detail below.

The central storage system 106, in one embodiment, includes data to be compressed such as one or more indexes 116 associated with one or more databases 118. The central storage system 106, in one embodiment, also includes a slot directory 120, a prefix directory 122, and a suffix directory 124. The slot directory 120 includes slot information 126 associated with data to be sorted, which is a database index 116 in this example. The prefix directory 122 includes prefixes 128 comprising at least a portion of a given value of a data set. In an embodiment implementing a database environment, the given value can be a key of a record and the data set can be the record itself. The suffix directory 124 includes suffixes 130 comprising consecutive characters of a given value of a data set after a prefix of the given value.

In one embodiment, each suffix 130 is mapped to a related prefix so that the combination of the suffix and its related prefix form the complete index value. For example, a prefix of a value can be defined as a set of consecutive characters of a value comprising at least the first character of the value. A suffix of the value is the remaining set of consecutive characters that have not been chosen as the prefix (e.g., the characters after the prefix). For example, if a value is "11111011000" the prefix can be "11" and the suffix can be "111011000". The slot information 126 in the slot directory 120 includes mapping information that indicates what prefix a given suffix is mapped to. The slot directory 120, prefix directory 122, and suffix directory 124 are discussed in greater detail below. It should be noted that the various embodiments of the present invention can be scaled across multiple processing nodes or can reside at a single node.

As can be seen, a slot is an element in a slot directory 120. Each slot contains information about a key value. Therefore, in each index leaf page, the number of elements (slots) in the slot directory 120 is equal to the number of different key values stored in the page. The number of suffixes 130 stored in a page equals the number of different key values in the same page. Therefore, each entry in the suffix directory 124 corresponds to one key value. The number of prefixes 128, on the other hand, is typically smaller than the number of suffixes 130, as each prefix may correspond to several suffixes 130. Each of the suffixes 130 corresponding to a prefix 128 is said to "use" that prefix 130.

Data Compression and Compression Optimization

Continuing with the embodiment implementing a database, database files 118 store data in the rows and columns of tables (not shown) stored on data pages (not shown). In such a table the rows may correspond to individual records while the columns of the table represent attributes of the records. For example, in a customer information table of a database management system, each row might represent a different customer, while each column represents different attributes of the customers such as the name of each customer, the state where the customer resides, the amount owed by each customer and the cash receipts received from each customer.

Instead of providing for direct sorting and searching of the records in the tables, the database management system 114 relies on the index files 116, which include information or pointers about the location of the records in the tables stored in the database files 118. Indexes 116 organize data records based on the value of a key. For example, an index for a customer table can be indexing on the state where a customer resides. The index, in this example, includes an entry for each state value followed by a list of RIDs for all the customers that have a particular state value.

An index 116 can be searched and sorted (scanned) much more rapidly than can the database files 118. An index 116 is scanned through transactions in which criteria are stipulated for selecting records from a table. These criteria include keys, which are the attributes by which the database finds the desired record or records using the index. All data is stored in tables on a set of data pages that are separate from the indexes 116. All of the indexes 116 for a table include only the key values and record identifiers ("RIDs") of records including these key values.

An RID can include page number information, slot number information, and a flag(s). The page number information indicates a page in the table where the data record associated with the RID is stored. A page comprises multiple data records that are distinguished by a slot number associated with teach data record. Information corresponding to the slot number is stored in the slot number section of the RID. The flag(s) is used to indicate if the record associated with the RID has been deleted, modified, or the like. The RID comprising page number information, slot number information and one or more flags is stored within an index 116, which includes multiple RIDs and flags for all records sharing the same key value.

One common type of index is a B+ tree having N levels of nodes or pages. The starting node at the top of the tree is called the root node and defines the interval of key values that the B+ tree index covers. In the successive lower levels of nodes before the lowest level of nodes, this key value interval is broken up into key value sub-intervals. Finally, the leaf nodes or pages in the lowest level of the tree contain the individual key values within the interval, together with the associated record (row) identifiers that enable the records having those key values as attributes to be located in the tables of the database files. The leaf pages of an index contain entries (keys) each of which is conceptually a {key-value, RID} pair where the RID is treated as if it were an extra key field.

The leaf pages of an index such as a B+ tree index, in many instances, contain a majority of the data within the index, and therefore, take up most of the storage space consumed by the index. Therefore, compression of the leaf pages alone can provide substantial storage space gains. Therefore, the following discussion on data compression and compression optimization uses the {key-value, RID} pair data of index leaf pages as a non-limiting example of the data to be compressed.

Figures 2, 3:
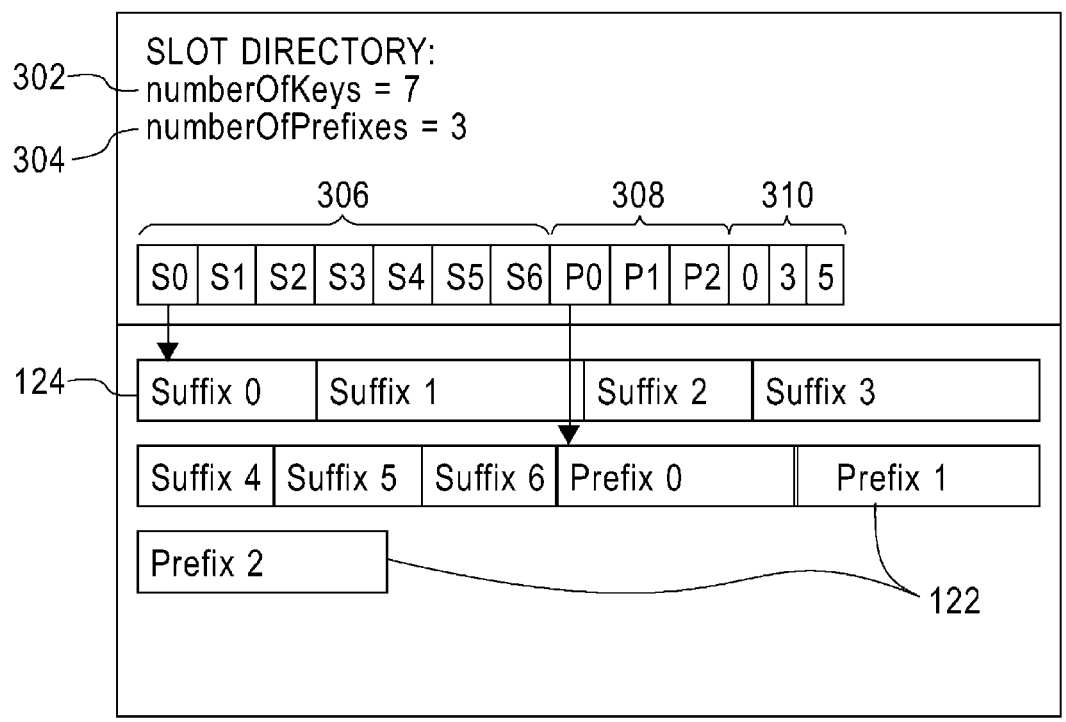
FIG. 2 shows one example of a multi-part key according to one embodiment of the present invention.
FIG. 3 is a block diagram illustrating one example of a slot directory according to one embodiment of the present invention.

As discussed above, storing keys in leaf pages in an uncompressed format requires a large amount of storage and is inefficient. Because keys are generally stored in leaf pages in a sorted fashion many keys stored in the same leaf page share a common prefix. For example, FIG. 2 shows one example of uncompressed multipart keys 202, 204, 206, 208 that can be stored within leaf pages. As can be seen from FIG. 2, a multipart key 202 is comprised of multiple parts such as a "Date" field 210, a "LocationID" field 212, a "CustomerID" field 214, and a "ProductID field 216". Each of the keys 202, 204, 206, 208 shown in FIG. 2 has a common prefix of "20080602S32C738272772". In one embodiment, each character of the multipart keys is stored as a data byte. As can be seen, storing each complete key value separately wastes valuable storage space by repeating the common prefix in each value. Therefore, the data manager 108 of one embodiment, via the compression manager 110, compress the index 116 by storing common prefixes (e.g. a prefix that is shared between at least two keys) only once in an array (e.g., prefix directory 122) in each leaf page (herein referred to as "prefix compression") and key suffixes for each value are stored in another array (e.g., suffix directory 124). The slot directories 120 allow reconstruction of the original key values.

In one embodiment, the data manager 108, via the compression manager 110, initially receives/retrieves as input a stream of pairs of the form {key-value, RID}, sorted by key value. As discussed above, the data manager 108 maintains a prefix directory 122, a suffix directory 124, and a slot directory 120. FIG. 3 shows one example of a slot directory 122 that contains data encoded as prefixes and suffixes. In one embodiment, the slot directory 122 includes information about both the prefixes and the suffixes of the data to be compressed (keys in this example).

As shown in FIG. 3, the slot directory includes a field 302 that indicates the number of keys in the page and a field 304 that indicates the number of prefixes in the page. Also, separate lists in the slot directory 120 are included for prefix compression. A first list 306 contains pointers to each of the suffixes in a suffix directory 124. This suffix list 306 includes one entry for each key in the page. The suffix list 306 is followed by a prefix list 308 that point to each of the prefixes in the prefix directory 122. The prefix list 308 includes one entry for each prefix in the page. The prefix list 308 is followed by a list of numbers 310 that indicate, for each prefix in the prefix directory 122, the initial suffix number that uses each of those respective prefixes.

For example, the number "0" stored in the initial location of the list of numbers 310 indicates that suffix 0 is the first suffix of the suffix list 306 to use the first prefix stored in the prefix list 308, i.e., prefix 0. The number "3" indicates suffix 3 stored in the suffix list 306 is the first suffix to use the second prefix stored in the prefix list 308. Since suffix 3 is the first suffix to use the second prefix and suffix 0 is the first suffix to use the first prefix, the processing of one embodiment determines that suffix 0 through 2 all use the first prefix value. Similarly, the number "5" stored in the third location of the list of numbers 310 indicates that suffixes 5 to 7 of the suffix list 306 use prefix 2 of the prefix list 308.

In one embodiment, the first slot to use a given prefix is stored in the third list 310 instead of the last slot so that an update is not required for every key insertion during the index creation. The third list 310 is stored separately (as oppose to mixed in with the prefix offsets) so that most of the free-space management code can be reused. The third list 310 is not embedded into the prefix records so that the data manager 108 does not have to jump all over the page and visit multiple prefix records just to identify which prefix is used by a given suffix.

It should be noted that the data manager 108 in some instances stores a NULL prefix in the second list 308 that has 0 for its offset. For example, when the data manger 108 stores a NULL prefix when a key or group of keys do not share a common prefix with its neighboring keys. In order to get the prefixes close together for fast binary searching, the data manager 108, in one embodiment, groups prefixes with each other after the suffixes, at least initially after index creation. Another advantage of mixing prefix and suffix records in the same slot directory) is that it simplifies space management code and other code.

Storing the suffixes before the prefixes allows building the index without growing the suffixes backwards, which is able to cause page reorganizations when new RIDs are inserted into the index record. An alternative to the above prefix/suffix layout is, for example, to create a prefix section after the index node header, but before the slot directory. The unused portion of this page can count towards the total free space on the page.

If the index 116 has variable length string include columns, the data manger 108 stores a reserved space indicator bit in the first variable length keypart. Because of prefix compression performed by the data manager 108, the first variable length keypart can be in the prefix or suffix area. However, there may be several suffixes sharing one prefix. If the reserved space indicator bit is stored at the prefix, the data manager 108 generally cannot identify which index key has the space reserved. To solve this problem, the data manager 108 extracts the common prefix up to the first variable length key part. In the case where the last keypart in a prefix is a variable length, there is a length field in both the suffix and the prefix and the data manager 108 can set the reserved space indicator bit in the length field in the suffix. For the purposes of extracting prefixes, a key part is a user definable portion of a key. For example, for an index defined on a combination of multiple columns, a key be broken into multiple key parts by defining each key part to correspond to a column. As another example, a key can be broken into key parts at byte boundaries, so each byte is a key part. The term "logical key parts" refers only to parts defined at column boundaries.

In one embodiment, the prefix records 128 have the following format: a 2-byte length field; and a key part data field. The prefix record 128, in this embodiment, has the following properties. The prefix record length is greater than 0 and a special NULL prefix has an offset of 0 and does not have a prefix record associated with it. The last key part in the prefix record can include a partial logical key part for the following data types: (1) CHAR, (2) VARCHAR, (3) GRAPHIC, (4) VARGRAPHIC, (5) BINARY (internal data type), and (6) VARBINARY (internal data type). When the last key part in the prefix record is a partial key part, the partial key part is more than just the NULL indicator.

Suffix records, in one embodiment, have the following format: a 2-byte length field; key part data field; and a RID list. The suffix record 130, in this embodiment, has the following properties. When the last byte of the associated prefix record 128 is for a variable length logical key part, then the first item in the key part data for the suffix record 130 is a length indicator to indicate how many more bytes of data belong to previous key part. In other words, when key parts are defined at byte level, a logical key part can be broken into two parts: a given number of bytes from the beginning stored as part of the prefix, and the remaining bytes stored as part of the suffix. In such a case, the length of each of the two parts is stored in its own length indicator field.

It should be noted that the number of bytes of data that belong to a previous key part can be zero. For variable length types, the data manager 108 stores the length of the actual prefix and suffix. The reason the actual length is stored in the suffix as oppose to the total length is that this allows for fewer bytes (i.e. 1 byte instead of 2 bytes for the length) to be used since smaller lengths can be represented with fewer bytes than larger lengths. When there is a partial key part for a fixed-length type such as CHAR, the number of bytes for the partial key part in the suffix can be calculated based on the length of the last key part in the prefix record 128.

When building an index 116 with prefix compression the data manager 108, in one embodiment, builds the keys on the leaf pages using the longest prefixes possible. Then when the page is full, the data manager 108, via the compression optimizer 112 of one embodiment of the present invention, optimizes the prefixes by merging neighboring prefixes until a set of prefixes is reached. To aid in the construction of an index 116 with prefix compression, the data manager 108 utilizes a data structure that includes: (1) pointers to temporary buffers used for constructing prefixes and suffixes; (2) a pointer to a buffer used to include the previous key in uncompressed format so that the data manager 108 can easily check if the next key is a duplicate; (3) pointer to where the last prefix was just inserted; (4) a flags field; and (5) pointers to two buffers for prefix meta data which is used during the compression optimization phase.

As discussed above, the data manager 108 builds the keys on the leaf page using the longest prefixes possible. When building the index 116, the data manager 108, in one embodiment, calculates the amount of space required for inserting a key in a leaf page using prefix compression if possible. The data manager 108 calculates the amount of space required as follows. If the page is empty the key being inserted is the first key on the page so the data manager 108 calculates the space required to insert the key without prefix compression.

If the data manager 108 determines that the page is not empty, the data manager 108 identifies the longest prefix shared between the current key to be inserted and the previous inserted key. If the keys do not share a common prefix then the data manager 108 calculates the space required to insert the new key in an uncompressed format. Also, if the page has at least one prefix and the last prefix in the page is not the NULL prefix, then the data manager 108 calculates the space required to add the NULL prefix to the page. If the keys share a common prefix and the new prefix (the current prefix to be inserted) is the first prefix on the page then the data manager 108 calculates the space required to add the prefix and the suffix of the new key (the current key to be inserted). The data manager 108 also calculates the space saved by adjusting the previous key to use this suffix. The data manager 108 further calculates the space required to add the NULL prefix if there is more than one key on the page since those keys cannot use the same prefix (if these keys could use the same prefix the current prefix would not be the first prefix on the page).

If the keys share a common prefix and the new prefix is not the first prefix on the page, then the data manager 108 compares the length of the new prefix with the length of the previous prefix. If the data manager 108 determines that the lengths are equal then the keys are the same and the new key can use the existing prefix and the data manager 108 calculates the length required to insert only the suffix. If the length of the new prefix is shorter than the previous prefix, then the data manager 108 inserts both a new prefix and the suffix using the new prefix and the length required to perform this is calculated.

If the length of the new prefix is longer than the previous prefix, then the new prefix is a longest prefix for both the new key and the previous key. The data manager 108 calculates the length required to insert the new key and new suffix, as well as the space saved by adjusting the previous key to use the longer prefix. Also, since after adjusting the previous key no other suffixes are using the previous prefix, the data manager 108 then calculates the space saved by freeing that prefix.

Once the data manager 108 calculates the amount of space required for inserting a key in a leaf page using prefix compression (if possible) based on one or more of the conditions discussed above, the data manager 108 determines if there is enough space available for the insertion. If there is not sufficient space available the data manager 108 performs compression optimization, which is discussed in greater detail below. If the optimization process was able to free up storage space, then the data manager 108 once again performs the storage calculations discussed above. If the data manager 108 determines that sufficient storage still does not exist, the data manager 108 determines if the prefix to be inserted is a new prefix and whether storing this prefix requires more space instead of saving space. If the data manager 108 determines that inserting a new prefix uses more space, the data manager tries to identify a way to insert the key using less storage space, e.g., by using an exiting prefix or the NULL prefix.

If the data manager 108 determines there is enough storage space for inserting a key in a leaf page using prefix compression (if possible), the data manager 108 performs the insertion operation based on the conditions determined during the storage calculation operations discussed above. The data manager 108 can also store a new suffix mapped to the prefix being inserted onto the page immediately after the previous suffix. The data manager 108 can store the prefix 130 being inserted on the page before the previously stored prefix. The building of prefix records start at the end of the page and work their way backwards. When the data manager 108 is finished with the page, the prefix records are moved so that free space is at the end of the page and not between prefix and suffix records. The data manager 108 can also update the last suffix to use a longer prefix and delete the shorter prefix if no other suffixes are using it. Stated differently, several suffixes typically correspond to, or "use", a certain prefix. When a prefix does not have any more suffixes attached to it, this prefix can be safely deleted.

FIG. 4 shows one example of pseudo code for building a compressed page as discussed above. In particular, the pseudo code of FIG. 4 illustrates a procedure performed by the data manager 108 that reads keys from a sorted list of {key-value, RID} and builds data structures needed to later build a compressed page. The data structures created by the data manager 108 include a prefix directory array 122. The prefix directory array 122 includes for every prefix 128: (1) the first suffix number which has this prefix; (2) a pointer (or offset) to the prefix; and (3) bit flags that include a bit indicating if the prefix has been deleted. The data structures also include a prefix value array/directory 122 that has the list of prefixes and a suffix value array that has the suffix followed by the RID and RIDFlags which match the suffix.

The main routine illustrated in FIG. 4 calls a triggerOptimization routine, which is described in detail below in FIG. 5, to optimize the prefixes. The main routine illustrated in FIG. 4 further calls a storeSuffix function to store a suffix at location suffixDir; a storeprefix function to store a prefix; an adjustSuffix function to change a previously stored suffix; a getPrefix function to get the prefix at a location; and a compare function to compare two keys identify a common prefix.

The data manager 108 at line 402 retrieves the data pair (k, rid) by retrieving the nest key and RID from the sorted list. The data manager 108 at line 404 calls a function storePrefix (NULL, 0) to store prefix NULL at array position 0. The data manager 108 at line 406 calls function storeSuffix (k, NULL, rid, suffixDir) to store suffix k and rid at a specified suffix directory position. Because the prefix at line 404 is NULL the suffix stored at line 406 is the entire key value. The data manager 108 then iterates a processing loop including the operations shown in lines 408-448 indefinitely, as indicated by the while (1) loop (line 407). The data manager 108 at line 408 (kNext, ridNext=get next key and rid) retrieves the next key and RID from the sorted list.

The data manager 108 at line 410 if (Knext==NULL) determines if the current key that was retrieved from the sorted list is equal to NULL. If the current key is equal to NULL this indicates that the sorted list has been emptied. The data manager at line 412 storeSuffix(NULL, NULL, 0, suffixDir) stores suffix NULL and RID NULL in the suffix directory for the current key. The data manager at line 414 storePrefix(NULL, suffixDir) stores prefix NULL in the suffix directory for the current key.

The data manager 108 at line 416 if (Knext==k) determines if the current key that was retrieved from the sorted list is equal to the previously stored key. If the current key is equal to the previously stored key this indicates that the current key is a non-unique index repeated key. The data manager at line 418 storeSuffix(NULL, NULL, ridNext, suffixDir) stores only the RID in the suffix directory for the current key. If the current key does not equal NULL or the previously stored key then the data manager 108 at line 420 pre=compare(kNext,k) initiates a comparing operation to obtain the largest common prefix of the current key and the previously stored key.

The data manager 108 at line 422 lastPre=getPrefix(prefixDir) extracts the previously stored prefix from the prefix directory. The data manager 108 at line 424 firstDifPart=compare(pre,lastPre) compares the current prefix of the current key with the previously stored prefix. The data manager 108 at line 426 if (firstDifPart==−1) determines, based on the comparison, if the current prefix is the same as the previously stored prefix. If so, the data manager 108 at line 428 storeSuffix(kNext, pre, ridNext, suffixDir) stores only the suffix of the current key (where the suffix comprises the characters of the key after the prefix).

If the data manager 108 determines at line 430 else if (firstDifPart>len_in_key_par(lastPre)) that the current prefix is not the same as the previously stored prefix and that, as is indicated by the ">" sign, the previously stored prefix is a prefix of the current prefix (e.g., previously stored prefix is "ab" and the current prefix is "abc"), the data manager 108 continues to line 432. The data manager 108 at line 432 storePrefix(pre, suffixDir) stores the new prefix in the suffix directory. The data manager 108 at line 434 adjustSuffix (suffixDir) adjusts the previous key suffix to reflect a mapping to the new prefix that has been stored at line 432. The data manager 108 at line 436 storeSuffix(suffixDir) stores the new suffix (created from the suffix adjustment) in the suffix directory.

If the data manager 108 determines at line 438 else (firstDifPart<len_in_key_par(lastPre)) that the current prefix is not the same as the previously stored prefix and that the last prefix is not a prefix of the current prefix, as is indicated by the "<" sign, then the current prefix is a prefix of the last prefix (e.g., previously stored prefix is "abc" and the current prefix is "ab"), and the data manager 108 continues to line 440. The data manager 108 at line 440 storeSuffix(kNext, pre, ridNext, suffixDir) stores the suffix in the suffix directory. The data manager 108 at line 442 storePrefix(suffixDir) stores the prefix in the suffix directory. The data manager 108 at line 444 triggerOptimization(prefixDir, suffixDir) performs an optimization of the prefixes. The optimization process is discussed in greater detail below. The data manager 108 at line 446 initializes the variables k and rid for the next read from the sorted list. After each read from the sorted list and after the operations illustrated in lines 408-446 are performed another optimization (line 448) of the prefixes is performed.

FIG. 5 shows one example of pseudo code for optimizing the prefixes. In particular, the pseudo code of FIG. 5 illustrates a procedure performed by the data manager 108 that optimizes the prefixes to the left (e.g., previously stored) of the current prefix where the optimization is initiated. The data manager 108 when performing the optimization procedure considers the storage costs of a prefix against the gains. While doing this, the data manager 108 compares the current prefix to the prefix to the left and to the right (e.g., subsequently stored) of the current prefix and, after an optimization, the data manager 108 checks if the nearest neighbors are the same. It should be noted that the longest prefix which is the nearest neighbor to the right of the current prefix either is a NULL prefix or a subset prefix of the current prefix. Therefore, there will always be a candidate to merge with the current prefix depending on costs.

The following is a brief description of the variables used in the TriggerOptimization routine of FIG. 5. The variable victimPrefix is equal to getPrefix(prefixDir−1). For example, prefixes stored as "ab", "abc", "ab" set victimPrefix as "abc". The variable leftPrefix is equal to getPrefix(prefixDir−2). For example, prefixes stored as "ab", "abc", "ab" set leftPrefix as "ab". The variable rightPrefix is equal to getPrefix(prefixDir). For example, prefixes stored as "ab", "abc", "ab" set rightPrefix as "ab".

The data manager 108 at line 502 if (leftPrefix==rightPrefix) determines if the prefix to the left of the current prefix is equal to the prefix to the right of the current prefix. For example, with the prefix set "ab", "abc", "ab" the data manager 108 determines if "ab"="ab". If so, the data manager 108 at line 504 if (compare(leftPrefix, victimPrefix)==len_in_key_parts(leftPrefix)) determines if the leftPrefix is a candidate for a merge. The function len_in_key_parts returns the number of key parts in its argument. If so, the data manager 108 at line 506 incrementalSavings=bytelen(victimPrefix)−bytelen(leftPrefix) determines a savings associated with merging the leftPrefix with the victim prefix. The data manager 108 at line 508 sets variable nOccVictim equal to getOcc(prefixDir−1). The data manager 108 at line 510 benefit=(bytelen(victimPrefix)+2*prefixOverhead)−nOccVictim*incrementalSavings determines a benefit of merging the leftPrefix with the victim prefix. The data manager 108 at line 512 if (benefit>0) if the benefit determined at line 510 of merging the leftPrefix with the victim prefix is greater than 0. If so, the data manager 108 at lines 514 and 516 merge(prefixDir−1, prefixDir−2), merge(prefixDir, PrefixDir−2) merges the victimPrefix with the leftPrefix and then merges the rightPrefix with the leftPrefix.

If data manager 108 determines that the prefix to the left of the current prefix is not equal to the prefix to the right of the current prefix the data manager 108, but the leftPrefix is a candidate to merge (line 518) if (compare(leftPrefix, victimPrefix)==len_in_key_parts(leftPrefix)), the data manager 108 continues to at line 520. The data manager 108 at line 520 incrementalSavings=bytelen(victimPrefix)−bytelen(leftPrefix) determines a savings associated with merging the leftPrefix with the victim prefix. The data manager 108 at line 522 sets variable nOccVictim equal to getOcc(prefixDir−1). The data manager 108 at line 524 benefit=(bytelen(victimPrefix)+prefixOverhead)−nOccVictim*incrementalSavings determines a benefit of merging the leftPrefix with the victim prefix. The data manager 108 at line 526 if (benefit>0) determines if the benefit determined at line 526 of merging the leftPrefix with the victim prefix is greater than 0. If so, the data manager 108 at line 528 merge(prefixDir−1, prefixDir−2)) merges the victimPrefix with the leftPrefix. For example, with the prefix set "ab", "abc", "ab" this result in "ab", "ab"

With respect to the rightPrefix the data manager 108 at line 530 if (compare(rightPrefix, victimPrefix)==len_in_key_parts(rightPrefix)) determines if the rightPrefix is a candidate for merging with the victimPrefix (this should generally hold true). If so, the data manager 108 at line 532 incrementalSavings=bytelen(victimPrefix)−bytelen(rightPrefix) determines a savings associated with merging the rightPrefix with the victim prefix. The data manager 108 at line 534 sets variable nOccVictim equal to getOcc(prefixDir−1). The data manager 108 at line 536 benefit=(bytelen(victimPrefix)+prefixOverhead)−nOccVictim+incrementalSavings determines a benefit of merging the rightPrefix with the current prefix. The data manager 108 at line 538 if (benefit>0) determines if the benefit determined at line 536 of merging the rightPrefix with the victim prefix is greater than 0. If so, the data manager 108 at line 526 merge(prefixDir, prefixDir−1)) merges the victimPrefix into the rightPrefix. For example, with the prefix set "abc" and "ab" this results in "ab".

FIG. 6 shows one example of pseudo code merge(dest, source) for merging two adjacent prefixes. For example a left prefix can be "ab", a middle prefix can be "abc", and the right prefix can be "a". The merge can be for merging "abc" to "ab" and for merging "ab" to "a". The data manager 108 at line 602 increments the slot count when the slot=first slot of source or the slot<first slot of (source+1). The data manager 108 at line 604 then prepend diff(getPrefix(source), getPrefix(dest)) to suffix(slot). The data manager 108 at line 606 then marks the source prefix as deleted in the prefix directory. If the destination is greater than the source then the data manager 108 at line 608 copy firstSlot from source to dest in prefix directoy merges to the right. For example, if the prefixes are "ab", "abc", "ab" and the data manager is merging "abc" to the right prefix "ab" then the offset of "abc" has to be adopted by the right prefix "ab".

FIG. 7 illustrates one example of the compressing prefixes of sorted values and then optimizing the prefix compression using the process discussed above with respect to FIGS. 4-6. In one embodiment, the data manager 108 receives as input a stream of pairs of the form (key value, record identifier), sorted by the key value. As discussed above, the data manager 108 maintains a prefix directory 122, a suffix directory 124 and a slot directory 120. The following discussion refers to the reading of each pair as a processing step.

The data manager 108, at step 702, reads the first key value "aabc" and the first RID, "r1" from a "Key:RID" column 701 that stores the Key-RID pair discussed above. Because there is not a previous key value to compare against as shown by the "NULL" entry under the "Current Prefix" 703, the current common prefix is the empty string, represented as "NULL" in FIG. 7. The "Current Prefix" 703 column stores a current prefix that is shared between the current key-RID pair and a previously stored key-RID pair. The data manager 108 enters this current prefix "NULL" into the "Prefix Directory" column 705 as a first entry. The data manager 108 then enters the current suffix into the "Suffix Directory" column 707, which is the entire key value "aabc" followed by the RID "r1" since the current prefix is the empty string. Thus, as shown in FIG. 7, the data manager 108 enters "aabc:r1" into the suffix directory. It should be noted that colon ":" is used here for readability, the binary encoding can be different.

The data manager 108, at step 704, reads the next (key value, RID), which, in this example, is "aabd:r2". The data manager 108 compares this key value with the previous key value of "aabc" and extracts the common prefix of "aab". The data manager 108 appends this current prefix "aab" to the prefix directory. The data manager 108 then compares the current prefix "aab" with the previous prefix "NULL". Because the previous prefix "NULL" can be considered to be a prefix of the current prefix "aab", the last suffix written into the suffix directory is adjusted accordingly. For example, the last suffix of "aabc:r1" is adjusted to "c:r1" and is attached to the prefix "aab". Next, the current suffix "d:r2" is appended to the suffix directory. It should be noted that for readability the sets of suffixes that correspond to each prefix in the prefix directory are separated by a vertical bar "|". Note that the first prefix "NULL" is currently left with an empty set of corresponding suffixes, i.e., there are no suffixes preceding the first vertical bar "|".

The data manager 108, at step 706, reads the next (key value, RID) of "aabd:r3" and determines that the current key value "aabd" is the same as the previous key value "aabd". Therefore, the data manager 108 appends the current RID "r3" to the last suffix (there is no need to create a new prefix). The data manager 108, at step 708, reads in the (key value, RID) of "abca:r4" and compares the current key value "abca" to the previous key value "aabd". The data manager 108 determines from this comparison that the common prefix is "a". This prefix "a" is appended to the prefix directory and the corresponding suffix "bca:r4" is appended to the suffix directory.

The data manager 108, at step 710, reads in the (key value, RID) of "abcd:r5". The data manager 108 compares the current key value of "abcd" with the previous key value of "abca" and determines that the common prefix is "abc". Therefore, the data manager 108 appends the common prefix "abc" to the prefix directory and adjusts the last suffix "bca:r4" to "a:r4". The data manager 108 also inserts the current suffix "d:r5" into the suffix directory and eliminates prefix "a" as it is no longer used by any suffix.

The data manager 108, at step 712, reads in the (key value, RID) of "abce:r6". The data manager 108 compares the current key value of "abce" with the previous key value of "abcd" and determines that the common prefix is "abc". Because the common prefix of "abc" is the same as the last prefix "abc" the data manager 108 only inserts the current suffix "e:r6" into the suffix directory. The data manager 108, at step 714, reads in the (key value, RID) of "abcf:r7". The data manager 108 compares the current key value of "abdf" with the previous key value of "abce" and determines that the common prefix is "ab". The data manager 108 appends the current prefix of "ab" into the prefix directory and adds the current suffix "|df:r7" to the suffix directory.

The data manager 108, at step 716, performs the optimization process discussed above. For example, the data manager 108 analyzes a victim prefix, which is prefix "abc" in this example, for its usefulness versus its storage cost overhead. Based on the process discussed above with respect to FIG. 5 the data manager 108 merges prefix "abc" with the right prefix of "ab". As a result of this merging the data manager 108 adjusts all of the suffixes of prefix "abc" to this new prefix of "ab". For example, prior to the merging, the suffixes of prefix "abc" were "a:r4, "d:r5", and "e:r6". However, because prefix "abc" was merged into prefix "ab" these suffixes were adjusted to "ca:r4, "cd:r5", and "ce:r6". This operation can save a significant amount of storage space. For example, if "a" and "b" each represent a 100 character string and "c" represents 1 character a non-optimized prefix directory at step 714 is 701 characters long ("aab"=300 characters, "abc"=201 characters, and "ab"=200 characters). By performing the optimization step as shown in step 716 the prefix directory is no only 500 characters long and the suffix directory has only increased by 3 characters. Therefore a savings of 198 characters has occurred.

Figure 8:
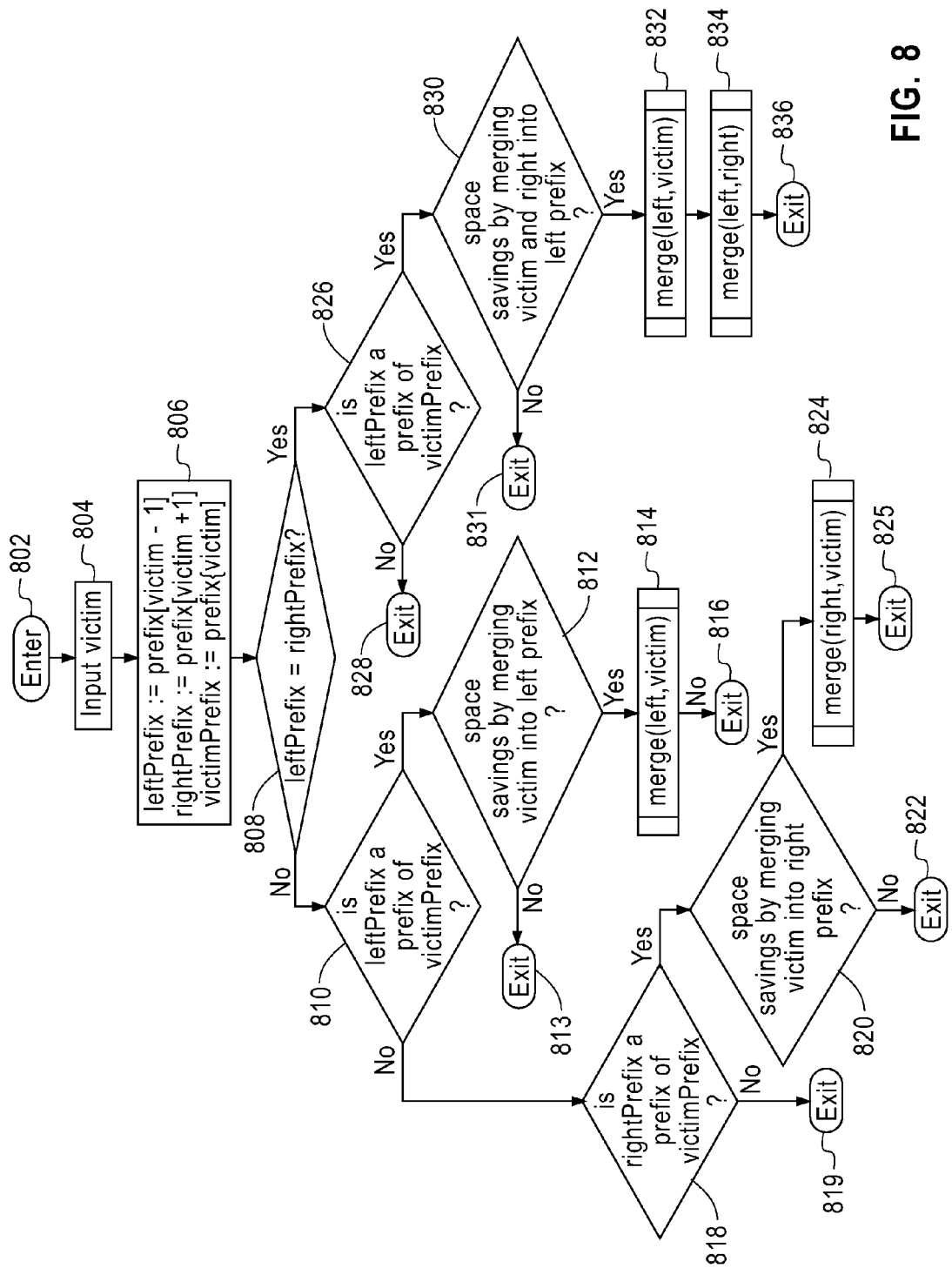
FIG. 8 is an operational flow diagram illustrating one process for optimizing the compression of sorted date values according to one embodiment of the present invention.

FIG. 8 is an operational flow diagram illustrating one process for optimizing prefix compression as discussed above with respect to FIG. 5. The operational flow diagram begins at step 802 and flows directly into step 804. The data manager 108, at step 804, determines a selected victim prefix to perform optimization on and at step 806 determines the prefixes that are stored to the right and left of the victim prefix. For example, assume a prefix set of "aab", "abc", and "ab". The victim prefix is "abc", the left prefix is "aab" and the right prefix is "ab".

The data manager 108, at step 808, determines if the left prefix is equal to the right prefix. For example, the data manager 108 determines if "aab" is equal to "ab". If the result of this determination is negative, the data manager 108, at step 810, determines if the left prefix is a prefix of the victim prefix. For example, the data manager 108 determines if "aab" is a prefix of "abc". If the result of this determination is positive, the data manager 108, at step 812, determines if any space savings would occur if the victim prefix is merged into the left prefix. If the result of this determination is negative, the control flow exits at step 813. If the result of this determination is positive, the data manager 108, at step 814 mergers the victim prefix into the left prefix. The control flow then exits at step 816.

If the result of the determination at step 810 is negative, the data manager 108, at step 818, determines if the right prefix is a prefix of the victim prefix. For example, the data manger 108 determines if prefix "ab" is a prefix of "abc", which in this example is true. If the result of this determination is negative, the control flow exits at step 819. If the result of this determination is positive, the data manager 108, at step 820, determines if any space savings would occur if the victim prefix is merged into the right prefix. If the result of this determination is negative, the control flow exits at step 822. If the result of this determination is positive, the data manager 108, at step 824 mergers the victim prefix into the right prefix. For example, victim prefix "abc" is merged into right prefix "ab" as discussed above with respect to FIG. 7. The control flow then exits at step 825.

Returning to step 808, if the left prefix is equal to the right prefix, the data manager 108, at step 826, determines if the left prefix a prefix of the victim prefix. If the result of this determination is negative, the control flow exits at step 828. If the result of this determination is positive, the data manager 108, at step 830, determines if there any space savings would occur if the victim prefix and the right prefix into the left prefix. If the result of this determination is negative, the control flow exits at step 831. If the result of this determination is positive, the data manager 108, at step 832 mergers the victim prefix into the left prefix and then at step 834 merges the right prefix into the left prefix. The control flow then exits at step 836.

Figure 9:
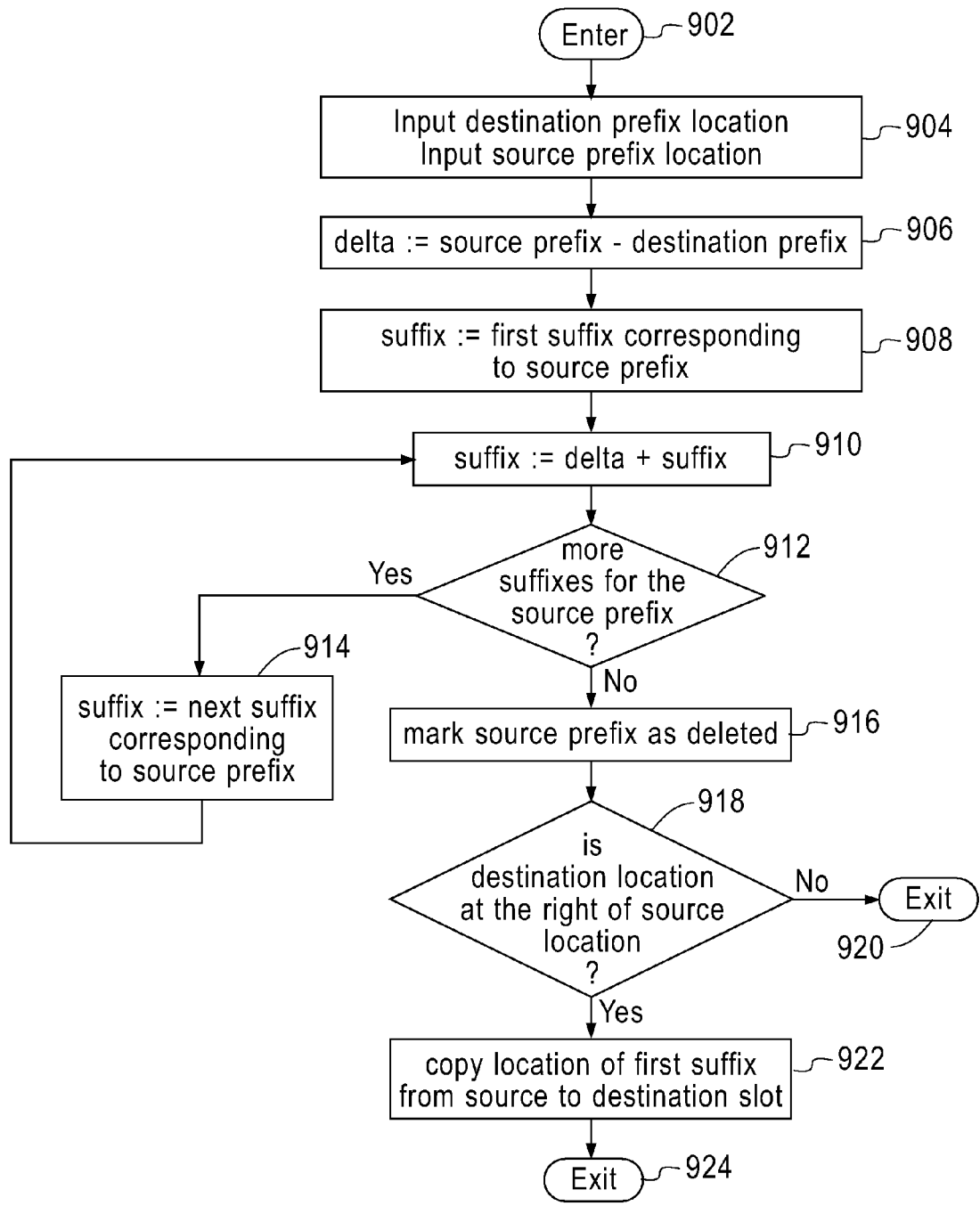
FIG. 9 is an operational flow diagram illustrating one process for merging compressed prefixes as part of the compression optimization according to one embodiment of the present invention.

FIG. 9 is an operational flow diagram illustrating one process for merging two adjacent prefixes discussed above with respect to FIG. 6. The operational flow diagram begins at step 902 and flows directly into step 904. The data manager 108, at step 904, receives as input the destination prefix location and the source prefix location. The data manager 108, at step 906, determines the delta between the source prefix and the destination prefix. The data manager 108, at step 908, then determines the first suffice corresponding to the source prefix. The data manager 108, at step 910, then sets this suffix equal to the delta determined at step 906 plus the suffix itself.

The data manager 108, at step 912, determines if there are any more suffixes for the source prefix. If the result of this determination is positive, the data manager 108, at step 914, sets the suffix equal to the next suffix corresponding to the source prefix and the control flow returns to step 910. If the result of this determination is negative, the data manager 108, at step 916, marks the source prefix as deleted. The data manager 108, at step 918, determines if the destination location is to the right of the source location. If the result of this determination is negative the control flow exits at step 920. If the result of this determination is positive, the data manager 108, at step 922, copies the location of the first suffix from the source to the destination slot. The control flow then exits at step 924.

Information Processing System

Figure 10:
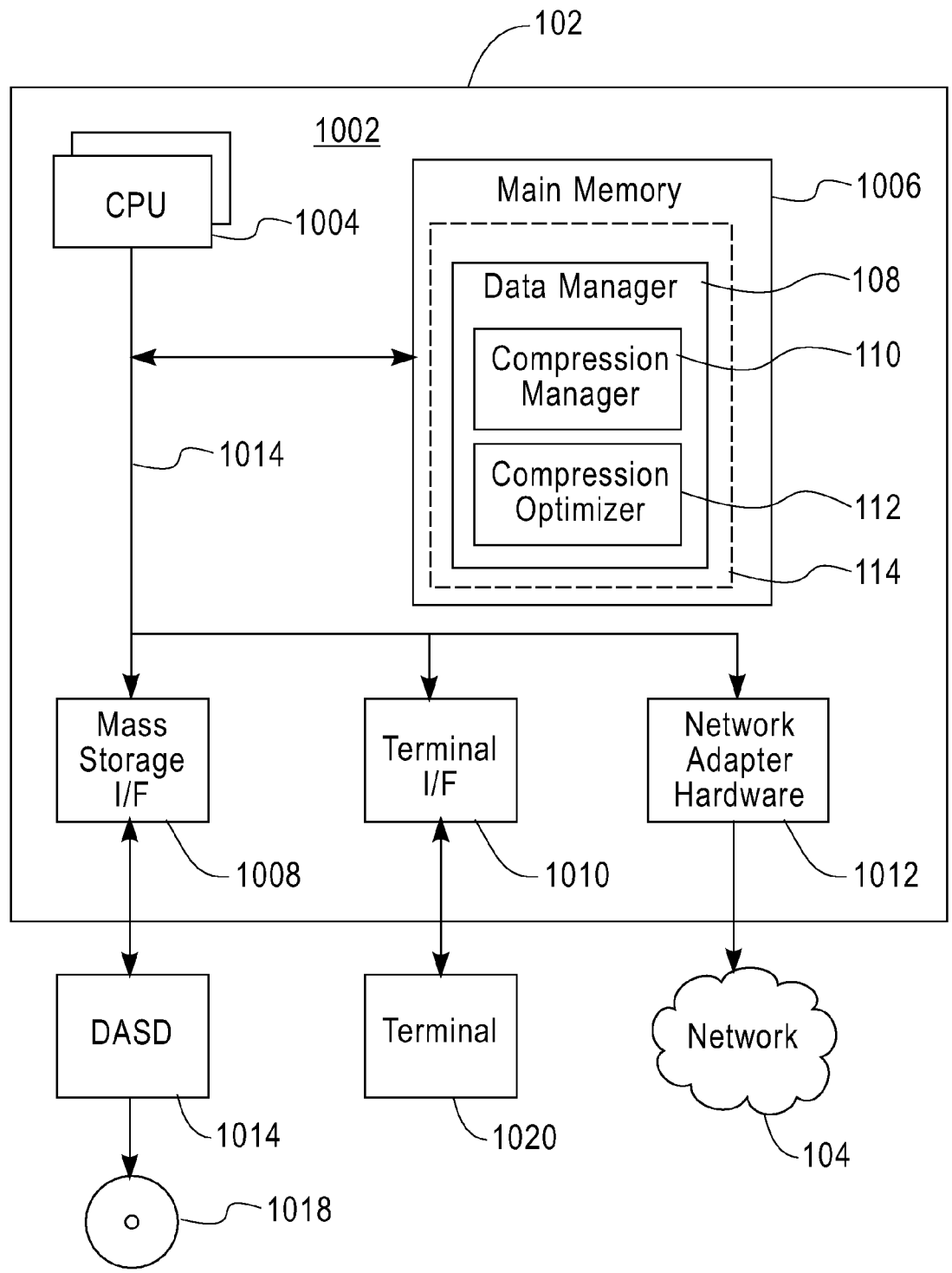
FIG. 10 is a block diagram illustrating a more detailed view of an information processing system according to one embodiment of the present invention.

FIG. 10 is a block diagram illustrating a more detailed view of the information processing system 102 according to one embodiment of the present invention. The information processing system 102 is based upon a suitably configured processing system adapted to implement the exemplary embodiment of the present invention. Any suitably configured processing system is similarly able to be used as the information processing system 102 by embodiments of the present invention such as an information processing system residing in the computing environment of FIG. 1, a personal computer, workstation, or the like.

The information processing system 102 includes a computer 1002. The computer 1002 has a processor 1004 that is connected to a main memory 1006, mass storage interface 1008, terminal interface 1010, and network adapter hardware 1012. A system bus 1014 interconnects these system components. The mass storage interface 1008 is used to connect mass storage devices, such as data storage device 1014, to the information processing system 102. One specific type of data storage device is an optical drive such as a CD/DVD drive, which may be used to store data to and read data from a computer readable medium or storage product such as (but not limited to) a CD/DVD 1018. Another type of data storage device is a data storage device configured to support, for example, NTFS type file system operations.

The main memory 1006, in one embodiment, comprises the data manager 108, compression manager 110, and the compression optimizer 112. In one embodiment, the main memory 1006 also includes the database management system 114 as well. In one embodiment the data manager 108 is adapted to compare at least a first prefix and a second prefix in a plurality of prefixes are compared. The plurality of prefixes defines at least a portion of a plurality of sorted values. A prefix is a set of consecutive characters comprising at least a first character of a sorted value. Consecutive characters after the prefix of the sorted value comprise a suffix of the sorted value. The data manager 108 is also adapted to determine that at least a first character of the first prefix and a first character of the second prefix are substantially identical. The compression manager 110 is adapted to merge the first prefix with the second prefix into a single prefix including the at least first character in response to the determination that the first character of the first prefix and the first character of the second prefix are substantially identical. The compression manager 110 is further adapted to update a set of suffixes associated with the first prefix to reflect an association with the second prefix in response to the merging.

Although illustrated as concurrently resident in the main memory 1006, it is clear that respective components of the main memory 1006 are not required to be completely resident in the main memory 1006 at all times or even at the same time. In one embodiment, the information processing system 102 utilizes conventional virtual addressing mechanisms to allow programs to behave as if they have access to a large, single storage entity, referred to herein as a computer system memory, instead of access to multiple, smaller storage entities such as the main memory 1006 and data storage 1016. Note that the term "computer system memory" is used herein to generically refer to the entire virtual memory of the information processing system 102.

Although only one CPU 1004 is illustrated for computer 1002, computer systems with multiple CPUs can be used equally effectively. Embodiments of the present invention further incorporate interfaces that each includes separate, fully programmed microprocessors that are used to off-load processing from the CPU 1004. Terminal interface 1010 is used to directly connect one or more terminals 1020 to computer 1002 to provide a user interface to the computer 1002. These terminals 1020, which are able to be non-intelligent or fully programmable workstations, are used to allow system administrators and users to communicate with the information processing system 102. The terminal 1020 is also able to consist of user interface and peripheral devices that are connected to computer 1002 and controlled by terminal interface hardware included in the terminal I/F 1010 that includes video adapters and interfaces for keyboards, pointing devices, and the like.

An operating system (not shown) included in the main memory is a suitable multitasking operating system such as the Linux, UNIX, Windows XP, and Windows Server 2003 operating system. Embodiments of the present invention are able to use any other suitable operating system. Some embodiments of the present invention utilize architectures, such as an object oriented framework mechanism, that allows instructions of the components of operating system (not shown) to be executed on any processor located within the information processing system 102. The network adapter hardware 1012 is used to provide an interface to a network 104. Embodiments of the present invention are able to be adapted to work with any data communications connections including present day analog and/or digital techniques or via a future networking mechanism.

Although the exemplary embodiments of the present invention are described in the context of a fully functional computer system, those skilled in the art will appreciate that embodiments are capable of being distributed as a program product via CD or DVD, e.g. CD 218, CD ROM, or other form of recordable media, or via any type of electronic transmission mechanism.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for compressing sorted values, the method comprising:

comparing at least a first prefix and a second prefix in a plurality of prefixes, wherein each prefix within the plurality of prefixes comprises at least a portion of a plurality of sorted values, and wherein a respective prefix within the plurality of prefixes comprises a set of consecutive characters including at least a first character of a respective sorted value within the plurality of sorted values, the respective sorted value further comprising a respective suffix comprising consecutive characters of the respective sorted value that are after the respective prefix, wherein each prefix in the plurality of prefixes is associated with a set of suffixes that are stored separately from each prefix;

determining that at least a respective first character of the first prefix and a respective first character of the second prefix are identical;

merging, in response to the determining, the first prefix with the second prefix into a single prefix comprising the at least first character; and updating, in response to the merging, a set of suffixes associated with the first prefix to reflect an association with the second prefix.

2. The method of claim 1, wherein the merging further comprises: deleting the first prefix from the plurality of prefixes.

3. The method of claim 1, wherein the updating further comprises:
updating the set of suffices to include a set of characters within the first prefix that fail to be identical to at least one character in the first prefix.

4. The method of claim 1, wherein the merging further comprises:
determining a cost savings associated with merging the first prefix with the second prefix.

5. The method of claim 4, wherein determining a cost savings associated with merging the first prefix with the second prefix comprises:
determining a first total amount of storage space required to store the first prefix merged with the second prefix;
determining a second total amount of storage space required to store the first prefix separate from the second prefix; and
comparing the first total amount of storage space with the second total amount of storage space.

6. The method of claim 4, wherein the merging further comprises:
merging, in response to the determining that the cost savings is above a given threshold, the first prefix with the second prefix into the single.

7. The method of claim 1, wherein the merging further comprises:
identifying a left prefix stored to in an array position immediately prior to the first prefix;
identifying a right prefix stored to in an array position immediately after the first prefix; and
determining that the left prefix comprises an initial portion of the first prefix, and wherein
the merging is performed in response to determining that the left prefix comprises an initial portion of the first prefix.

8. The method of claim 7, wherein the merging further comprises:
determining that the right prefix comprises an initial portion of the first prefix, and
wherein the merging is performed in response to determining that the left prefix comprises an initial portion of the first prefix.

9. The method of claim 7, wherein the merging further comprises
determining that the left prefix is equal to the right prefix;
determining that the left prefix comprises an initial portion of the first prefix;
merging, in response to determining that the left prefix is equal to the right prefix and that the left prefix comprises an initial portion of the first prefix, the first prefix into the left prefix; and
merging, in response to determining that the left prefix is equal to the right prefix and that the left prefix comprises an initial portion of the first prefix, the right prefix into the left prefix.

10. An information processing system for compressing sorted values, the method comprising:
a memory;
a processor communicatively coupled to the memory;
a prefix directory, coupled to the memory, comprising a plurality of prefixes, wherein each prefix within the plurality of prefixes comprises at least a portion of a plurality of sorted values, wherein each prefix within the plurality of prefixes comprises a set of consecutive characters including at least a first character of a respective sorted value within the plurality of sorted values;
a suffix directory, coupled to the memory, comprising a plurality of suffixes, wherein each suffix in the plurality of suffixes is associated with a prefix in the plurality of prefixes, and comprises a set of consecutive characters of the respective sorted value of the prefix, wherein the a set of consecutive characters are after the prefix,
wherein the prefix directory is separate from the suffix directory;
a data manager communicatively coupled to the memory and the processor, wherein the data manager is configured to compare at least a first prefix and a second prefix in the plurality of prefixes, and wherein the data manager is further configured to determine that at least a respective first character of the first prefix and a respective first character of the second prefix are identical;
wherein the data manager is further configured to maintain a list of suffix identifiers, wherein an entry position of a suffix identifier within the list of suffix identifiers corresponds to an entry position of a prefix in the prefix directory, and wherein a suffix identifier at the entry position identifies a first suffix in the plurality of suffixes that uses the prefix in the plurality of prefixes at the corresponding entry position in the prefix directory; and
a compression manager, coupled to the memory, configured to merge, in response to the at least a respective first character of the first prefix and the respective first character of the second prefix being identical, the first prefix with the second prefix into a single prefix comprising the at least first character, wherein the compression manager is further configured to update, in response to the first prefix and the second prefix being merged into a single prefix, a set of suffixes associated with the first prefix to reflect an association with the second prefix.

11. The information processing system of claim 10, wherein the compression manager is further configured to update by:
updating the set of suffices to include a set of characters within the first prefix that fail to be identical to at least one character in the first prefix.

12. The information processing system of claim 10, wherein the compression manager is further configured to merge by:
identifying a left prefix stored to in an array position immediately prior to the first prefix;
identifying a right prefix stored to in an array position immediately after the first prefix; and
determining that the left prefix comprises an initial portion of the first prefix, and
wherein the merging is performed in response to determining that the left prefix comprises an initial portion of the first prefix.

13. The information processing system of claim 12, wherein the compression manager is further configured to merge by:
determining that the right prefix comprises an initial portion of the first prefix, and
wherein the merging is performed in response to determining that the left prefix comprises an initial portion of the first prefix.

14. The information processing system of claim 12, wherein the compression manager is further configured to merge by:

determining that the left prefix is equal to the right prefix;
determining that the left prefix comprises an initial portion of the first prefix;
merging, in response to determining that the left prefix is equal to the right prefix and that the left prefix comprises an initial portion of the first prefix, the first prefix into the left prefix; and
merging, in response to determining that the left prefix is equal to the right prefix and that the left prefix comprises an initial portion of the first prefix, the right prefix into the left prefix.

15. A non-transitory computer program storage product for compressing sorted values comprising a non-transitory computer program storage medium comprising instructions for:
comparing at least a first prefix and a second prefix in a plurality of prefixes, wherein each prefix within the plurality of prefixes comprises at least a portion of a plurality of sorted values, and wherein a respective prefix within the plurality of prefixes comprises a set of consecutive characters including at least a first character of a respective sorted value within the plurality of sorted values, the respective sorted value further comprising a respective suffix comprising consecutive characters of the respective sorted value that are after the respective prefix, wherein each prefix in the plurality of prefixes is associated with a set of suffixes that are stored separately from each prefix;
determining that at least a respective first character of the first prefix and a respective first character of the second prefix are identical;
merging, in response to the determining, the first prefix with the second prefix into a single prefix comprising the at least first character; and
updating, in response to the merging, a set of suffixes associated with the first prefix to reflect an association with the second prefix.

16. The non-transitory computer program storage product of claim 15, wherein the instructions for updating further comprise instructions for:
updating the set of suffices to include a set of characters within the first prefix that fail to be identical to at least one character in the first prefix.

17. The non-transitory computer program storage product of claim 15, wherein the instructions for merging further comprise instructions for:
identifying a left prefix stored to in an array position immediately prior to the first prefix;
identifying a right prefix stored to in an array position immediately after the first prefix; and
determining that the left prefix comprises an initial portion of the first prefix, and
wherein the merging is performed in response to determining that the left prefix comprises an initial portion of the first prefix.

18. The non-transitory computer program storage product of claim 17, wherein the instructions for merging further comprise instructions for:
determining that the right prefix comprises an initial portion of the first prefix, and
wherein the merging is performed in response to determining that the left prefix comprises an initial portion of the first prefix.

19. The non-transitory computer program storage product of claim 17, wherein the instructions for merging further comprise instructions for:
determining that the left prefix is equal to the right prefix;
determining that the left prefix comprises an initial portion of the first prefix;
merging, in response to determining that the left prefix is equal to the right prefix and that the left prefix comprises an initial portion of the first prefix, the first prefix into the left prefix; and
merging, in response to determining that the left prefix is equal to the right prefix and that the left prefix comprises an initial portion of the first prefix, the right prefix into the left prefix.

20. A database system for compressing sorted values, the database system comprising:
at least one information processing system comprising:
a memory;
a processor;
a prefix directory comprising a plurality of prefixes, wherein each prefix within the plurality of prefixes comprises at least a portion of a plurality of sorted values, wherein each prefix within the plurality of prefixes comprises a set of consecutive characters including at least a first character of a respective sorted value within the plurality of sorted values;
a suffix directory comprising a plurality of suffixes, wherein each suffix in the plurality of suffixes is associated with a prefix in the plurality of prefixes, and comprises a set of consecutive characters of the respective sorted value of the prefix, wherein the a set of consecutive characters are after the prefix,
wherein the prefix directory is separate from the suffix directory;
a plurality of ordered indexes, each index within the plurality of indexes having a respective suffix stored in the suffix directory and an association to a respective prefix within the plurality of prefixes;
a data manager configured to compare at least a first prefix and a second prefix in the plurality of prefixes, wherein the data manager is further configured to determine that at least a respective first character of the first prefix and a respective first character of the second prefix are identical
wherein the data manager is further configured to maintain a list of suffix identifiers, wherein an entry position of a suffix identifier within the list of suffix identifiers corresponds to an entry position of a prefix in the prefix directory, and wherein a suffix identifier at the entry position identifies a first suffix in the plurality of suffixes that uses the prefix in the plurality of prefixes at the corresponding entry position in the prefix directory; and
a compression manager configured to merge, in response to the at least a respective first character of the first prefix and the respective first character of the second prefix being identical, the first prefix with the second prefix into a single prefix comprising the at least first character, and wherein the compression manager is further configured to update, in response to the first prefix and the second prefix being merged into a single prefix, a set of suffixes associated with the first prefix to reflect an association with the second prefix, wherein each suffix in the set of suffixes is updated to include a delta between the first prefix and the second prefix, and the suffix itself.

21. The database system of claim 20, wherein the compression manager is further configured to update by:
updating the set of suffices to include a set of characters within the first prefix that fail to be identical to at least one character in the first prefix.

22. The database system of claim 20, wherein the compression manager is further configured to merge by:

identifying a left prefix stored to in an array position immediately prior to the first prefix;

identifying a right prefix stored to in an array position immediately after the first prefix; and determining that the left prefix comprises an initial portion of the first prefix, and wherein the merging is performed in response to determining that the left prefix comprises an initial portion of the first prefix.

23. The database system of claim 22, wherein the compression manager is further configured to merge by:

determining that the right prefix comprises an initial portion of the first prefix, and wherein the merging is performed in response to determining that the left prefix comprises an initial portion of the first prefix.

24. The database system of claim 22, wherein the compression manager is further configured to merge by:

determining that the left prefix is equal to the right prefix;

determining that the left prefix comprises an initial portion of the first prefix;

merging, in response to determining that the left prefix is equal to the right prefix and that the left prefix comprises an initial portion of the first prefix, the first prefix into the left prefix; and merging, in response to determining that the left prefix is equal to the right prefix and that the left prefix comprises an initial portion of the first prefix, the right prefix into the left prefix.

* * * * *